(12) United States Patent
Luo et al.

(10) Patent No.: US 6,903,436 B1
(45) Date of Patent: Jun. 7, 2005

(54) MULTIPLE-TIME PROGRAMMABLE ELECTRICAL FUSE UTILIZING MOS OXIDE BREAKDOWN

(75) Inventors: Ruei-Chin Luo, Sanching (TW); Chung-Cheng Chou, Hsin-Chu (TW); Ching-Wei Wu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 10/833,968

(22) Filed: Apr. 27, 2004

(51) Int. Cl.[7] .......................... H01L 29/00; H01L 29/76
(52) U.S. Cl. .................... 257/529; 257/368; 257/379
(58) Field of Search ............................. 257/529, 530, 257/368, 379

(56) References Cited

U.S. PATENT DOCUMENTS

| 5,119,163 | A | * | 6/1992 | Ishihara et al. | 365/96 |
| 5,844,298 | A | * | 12/1998 | Smith et al. | 257/530 |
| 6,346,738 | B1 | * | 2/2002 | Kim et al. | 257/529 |
| 6,472,897 | B1 | * | 10/2002 | Shyr et al. | 324/765 |
| 2001/0052633 | A1 | * | 12/2001 | Oikawa | 257/529 |

OTHER PUBLICATIONS

Su et al., "Characteristics of Oxide Breakdown and Related Impact on Device of Ultrathin (2.2nm) Silicon Dioxide", The Japan Society of Applied Physics, Sep. 2003.

* cited by examiner

Primary Examiner—Ngân V. Ngô
(74) Attorney, Agent, or Firm—Baker & McKenzie LLP

(57) ABSTRACT

An improved a programmable electrical fuse device utilizing MOS oxide breakdown is described herein. The fuse device comprises a programmable MOS device having a first gate width, a reference MOS device having a second gate width that is substantially less than the first gate width, and a sense amplifier operable to detect a difference in current and generate a corresponding logical signal. According to one embodiment, the fuse device can be programmed only once to invert its logical state and thereby provide a changeable logical signal. This is done by applying an overvoltage signal to the programmable MOS device so that its oxide layer breaks down. Since the programmable MOS device and the reference MOS device are on opposite sides of the sense amplifier, an opposite logical signal is generated by shorting-out the programmable MOS device. According to another embodiment, the fuse device can be programmed and erased multiple times by breaking down oxide layers in MOS devices that are alternating sides of a sense amplifier.

15 Claims, 8 Drawing Sheets

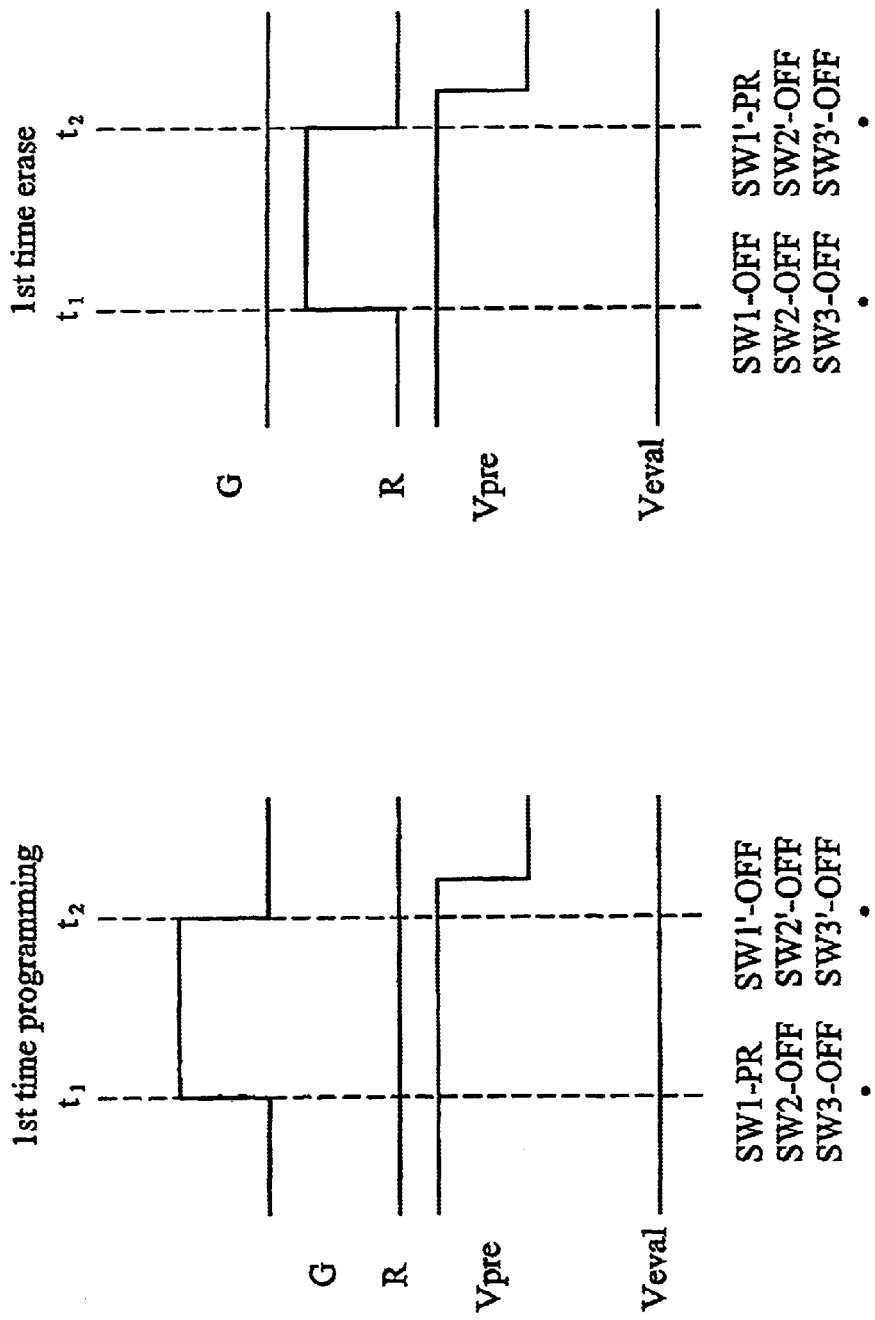

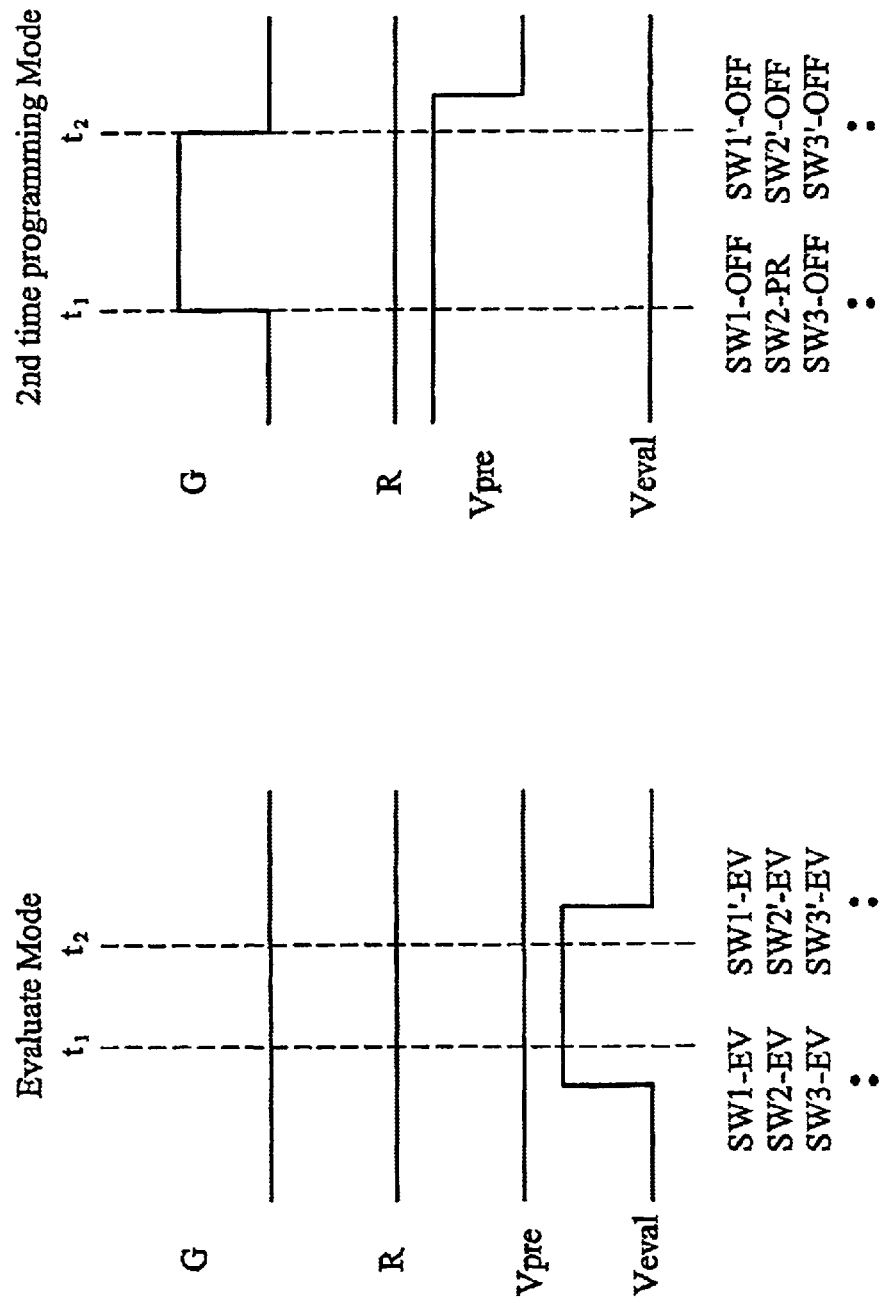

MULTIPLE-TIME PROGRAMMABLE ELECTRICAL FUSE UTILIZING MOS OXIDE BREAKDOWN

BACKGROUND

Fuses and anti-fuses are important components in modern semiconductor devices. In one application, fuses and anti-fuses can be used to deactivate defective rows of memory on a chip and activate redundant rows of memory to replace those defective rows, thus increasing the manufacturing yield of these semiconductor devices. In another application, fuses and anti-fuses can be used to activate and deactivate certain components on a semiconductor device, thereby allowing a customer to create application specific semiconductor device from a generic device. In yet another application, fuses and anti-fuses can be used to create serial numbers that uniquely identify the semiconductor device. One possible application of this technology is uniquely numbered computer chips for radio-frequency identification tags.

To suit these widely varying applications, it is desirable to use fuse and anti-fuse devices that do not require additional manufacturing steps and which can be reliably activated and deactivated. It is also desirable to utilize fuse devices that can be repetitively programmed and erased, as the need arises. It is also desirable to utilize fuse devices that have very low power dissipation in a standby mode. It is also desirable to utilize fuse devices that generate distinct and stable logic states for signal sensing.

BRIEF SUMMARY

An improved a programmable electrical fuse device utilizing MOS oxide breakdown is described herein. According to one embodiment, the fuse device can be programmed only once to invert its logical state and thereby provide a changeable logical signal. The one-time programmable embodiment comprises a programmable MOS device having a first gate width, a reference MOS device having a second gate width that is substantially less than the first gate width, and a sense amplifier that is connected to both devices. The reference MOS device is configured to present a closed circuit having the second gate width when a bias is applied across its source and drain. The programmable MOS device, prior to programming at least, is configured to present an open circuit when a bias is applied across its source and drain. In this configuration, when a bias is applied to the programmable and reference MOS devices, current will dissipate through the reference MOS device at a level determined by its second gate width. Since no current is dissipated through the programmable MOS device, the sense amplifier will detect that more current is passing through the reference MOS device and will generate a corresponding logical signal.

To program the one-time programmable electrical fuse device, an overvoltage signal is applied to the programmable MOS device so that its oxide layer is broken down. As a result, the programmable MOS device will present a short circuit having a first gate width when a bias is applied across its source and drain. After the fuse has been programmed, when a bias is applied to the programmable and reference MOS devices, current will dissipate through the MOS devices at a level determined by their respective gate widths. Since the first gate width is substantially larger than the second gate width, more current will pass through programmable MOS device than through the reference MOS device. The sense amplifier will therefore detect that more current is passing through the programmable MOS device and will generate a logical signal that is opposite to the initial logical signal.

According to another embodiment, the fuse device can be programmed and erased multiple times by using a plurality of programmable MOS modules that are arranged in parallel. Specifically, a plurality of first programmable MOS modules (having a first gate width) are arranged in parallel so that they can all be connected to one terminal of a sense amplifier. Similarly, a plurality of second programmable MOS modules (also having a first gate width) are arranged in parallel to a reference MOS device (having a second gate width that is substantially less than the first gate width). The plurality of second programmable MOS modules and the reference MOS device are connectable to the other terminal of a sense amplifier. The fuse device is programmed by applying an overvoltage signal to one of the first programmable MOS modules, thereby creating a path to ground with a larger gate width (W1) than the reference MOS device (W2). The fuse device can then be erased by applying an overvoltage signal to one of the second programmable MOS modules, thereby creating a path to ground having a larger gate width (W2+W1) that is greater than the gate width found in the first programmable MOS modules (W1). As a result, the logical signal generated by this circuit will revert to its original condition. The program and erase functions can be repeated until all of the programmable MOS modules have been expended.

BRIEF DESCRIPTION OF THE DRAWINGS

FIG. 5A depicts a representative timing diagram corresponding to a first-time program mode for a multiple-time programmable fuse device;

FIG. 5B depicts a representative timing diagram corresponding to a first-time erase mode for a multiple-time programmable fuse device;

FIG. 5C depicts a representative timing diagram corresponding to an evaluate mode for a multiple-time programmable fuse device;

FIG. 5D depicts a representative timing diagram corresponding to a second-time program mode for a multiple-time programmable fuse device.

DETAILED DESCRIPTION

Figure 1A:
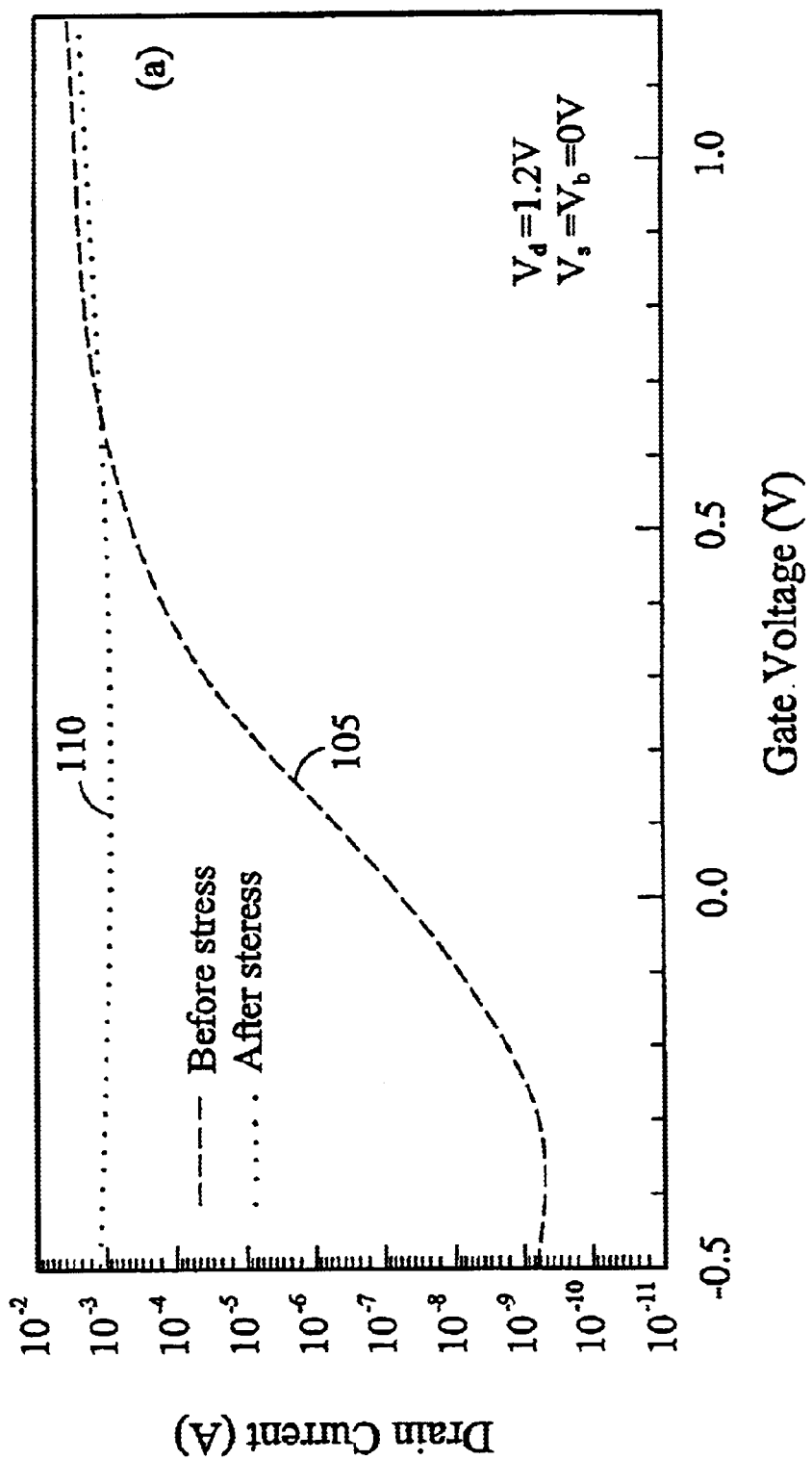
FIG. 1A depicts the gate voltage/drain current characteristics of a representative forward-biased MOS device before and after an oxide breakdown event.
Figure 1B:
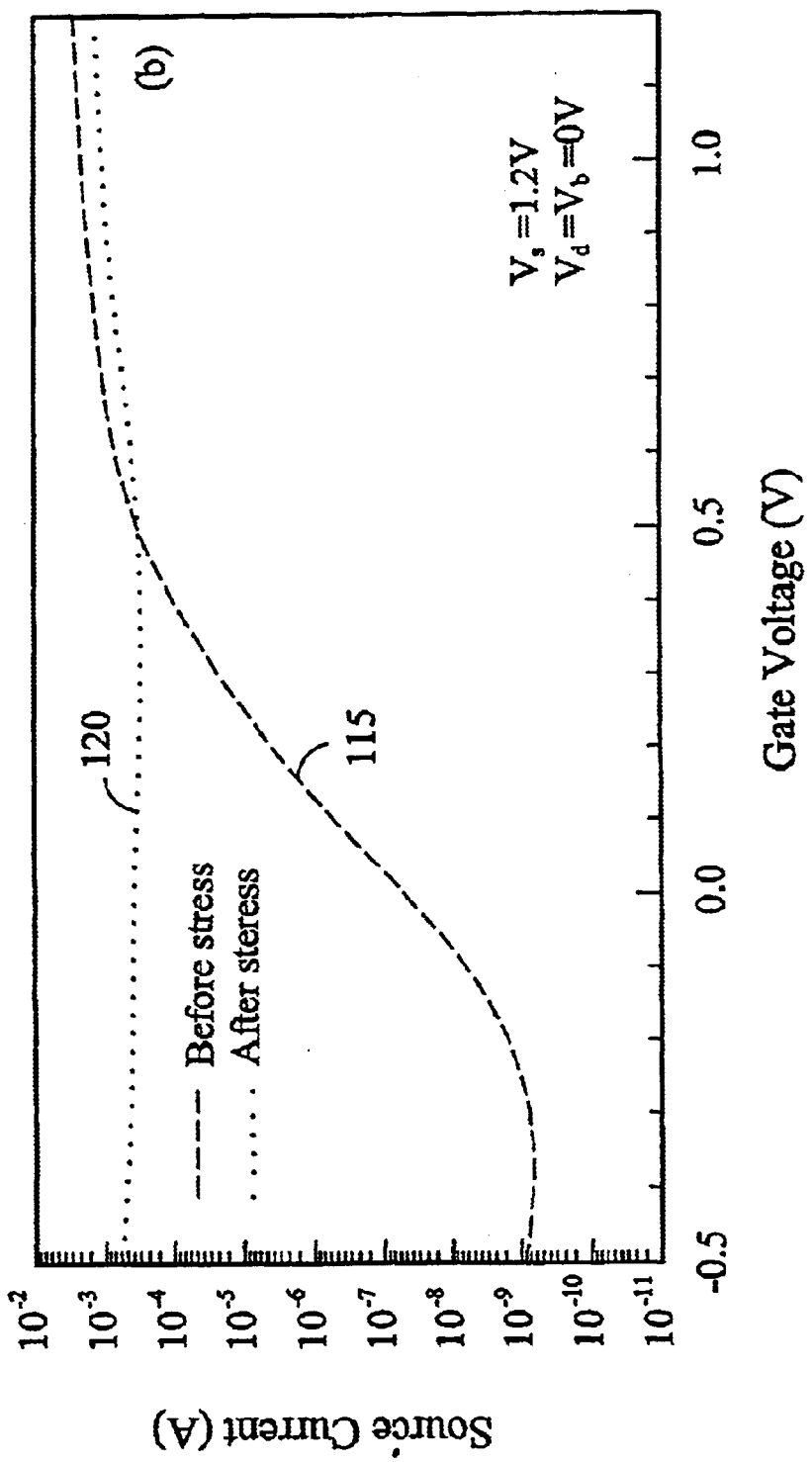
FIG. 1B depicts the gate voltage/drain current characteristics of a representative reversed-biased MOS device before and after an oxide breakdown event.

Described herein is a programmable electrical fuse device utilizing MOS oxide breakdown. The performance of a MOS device before and after an oxide breakdown event occurs is depicted in FIGS. 1A and 1B. In FIG. 1A, the relationship between gate voltage and drain current is depicted for a forward-biased MOS device both before and after an oxide stress event. Line 105 demonstrates that prior to an oxide stress event, drain current will increase as the gate voltage is increased. After the oxide stress event, however, line 110 demonstrates that the drain current remains constant at the saturation level regardless of the applied gate voltage. The performance of a reversed-biased MOS device before and after an oxide stress event is depicted in FIG. 1B. In FIG. 1B, line 115 demonstrates the relationship between gate voltage and source current prior to an oxide stress event. Line 115 demonstrates that as the gate voltage increases, the source current correspondingly increases until it reaches a saturation current level. After the oxide stress event, however, line 120 demonstrates that the source current will remain at or near the saturation level regardless of the applied gate voltage. Accordingly, by applying an oxide stress event of sufficient magnitude to a MOS device, the MOS device can be effectively short-circuited. Further details on the characteristics of a MOS device that has been subjected to oxide breakdown are described in the article Hung-Der Su, et al., "Characteristics of Oxide Breakdown and Related Impact on Device of Ultra-Thin (2.2 nm) Silicon Dioxide," Jap.J.Appl.Phys., vol. 42 (2003), which is hereby incorporated by reference into this specification.

Figure 2:
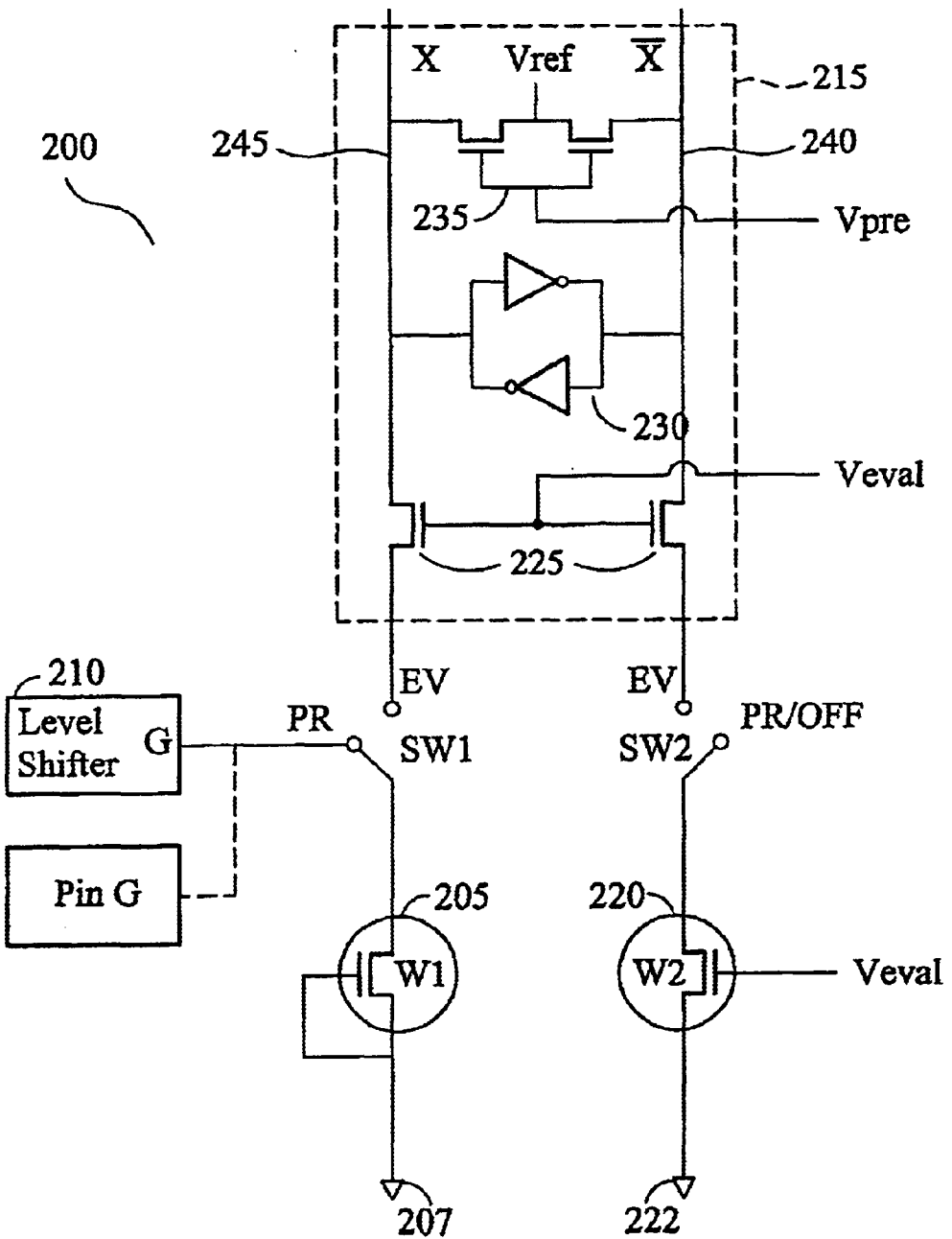
FIG. 2 depicts a representative embodiment of a one-time programmable fuse device.

Since a MOS device that has been subjected to oxide breakdown can be effectively converted from an open circuit to a closed circuit, the MOS device can be effectively used as a fuse or anti-fuse device. One embodiment of a one-time programmable fuse device 200 is depicted in FIG. 2. In FIG. 2, a programmable MOS device 205 is depicted in which its gate and source are connected to a ground terminal 207. The programmable MOS device 205 is preferably a short channel device; however, other channel lengths may be acceptable. According to one embodiment, the channel length is in the range of about 10 nm to about 1000 nm. The drain of the programmable MOS device 205 is connected to a switch SW1 that allows the device 205 to be connected to a programming apparatus 210 or to sense amplifier 215 through the PR and EV terminals, respectively. The programming apparatus 210 may comprise a level shifter or a pin that is capable of providing an over-voltage to the programmable MOS device 205 so as to break down the oxide layer of the MOS device 205. The over-voltage signal is represented by G and can comprise a range for voltages from about 0.01 V to about 10 V. Thus, when the switch SW1 is connected to the PR terminal, the programming apparatus 210 can provide an overvoltage signal G to the drain of the programmable MOS device 205 at a level sufficient to cause the oxide regions adjacent to the source and drain regions to break down, thereby producing a short circuit through the programmable MOS device 205. The programmable MOS device 205 has a gate width W1 that permits a predetermined amount of current to pass through the device.

Also depicted in FIG. 2 is a reference MOS device 220 that is also preferably a short channel device with channel characteristics similar to the programmable MOS device 205. The reference MOS device 220, however, has a gate width W2 that is substantially smaller than the gate width W1 of the programmable MOS device 205. Preferably, the differences in gate widths W1 and W2 should be in the range of about 10 nm to about 1000 nm. The source of the reference MOS device 220 is connected to a ground terminal 222 and the gate of the reference MOS device is connected to a terminal operable to provide an evaluation voltage $V_{EVAL}$. The drain of the reference MOS device 220 is connected to a second switch SW2. The second switch SW2 can be connected to a program/off terminal (PR/OFF) or to an evaluate terminal (EV). When the reference MOS device 220 is connected to the evaluate terminal EV, it is connected to the sense amplifier 215.

The sense amplifier 215 measures a difference in current flowing through the programmable MOS device 205 and the reference MOS device 220 to indicate a particular logic state. The sense amplifier 215 is designed to operate in two different modes: a precharge mode and an evaluate mode. In the precharge mode, the logical bit lines X and XBar are pulled to the reference voltage $V_{REF}$. The evaluate mode is used to determine which of the two bit lines are discharged quickest and amplify this difference as a logical output signal. Although one possible embodiment for a sense amplifier 215 is depicted in FIG. 2, one of ordinary skill will recognize the may variations of this circuit can be implemented to measure the difference in current between bit lines X and XBar in the evaluate mode.

In the embodiment depicted in FIG. 2, the precharge mode pulls the logical bit lines X and XBar to the reference voltage $V_{REF}$ by the precharge gates 235. The precharge gates 235 are activated when the precharge voltage $V_{PRE}$ is applied. The evaluate mode is activated immediately after the precharge mode by dropping the precharge voltage $V_{PRE}$ to low and activating the evaluation voltage $V_{EVAL}$. The evaluation voltage $V_{EVAL}$ activates the evaluation gates 225 so that the stored bias in the bit lines X and XBar is applied to the evaluation terminals EV. At the same time that the stored bias is applied to the evaluation terminals EV, switches SW1 and SW2 are connected to the evaluation terminals EV. By doing this, the stored bias in the bit lines X and XBar will be simultaneously applied to the programmable MOS device 205 and the reference MOS device 220. Since the evaluation voltage $V_{EVAL}$ is applied to the gate of the reference MOS device 220 during the evaluation mode, the reference MOS device 220 will present a closed circuit with a gate width W2. This will allow the charge stored in bit line XBar at a predetermined rate. On the other hand, the programmable MOS device 205 will present either an open circuit or a closed circuit in the evaluation mode, depending upon whether the oxide has been broken down.

If the oxide of the programmable MOS device 205 has not been broken down, then the stored bias in the bit line XBar will discharge more quickly than the stored bias in the bit line X. As the voltage level in bit line XBar decays, the differential amplifiers 230 will detect this difference and will cause the bit line X to be pulled high and the bit line XBar to be pulled low. If, on the other hand, the oxide of the programmable MOS device 205 has been broken down, then the stored bias in bit line X will discharge more quickly than the stored bias in bit line XBar because the gate width W1 of the programmable MOS device 205 is much greater than the gate width W2 of the reference MOS device 220. As a result, the differential amplifies 230 will cause the bit line X to be pulled low and the bit line XBar to be pulled high.

Figures 3A, 3B:
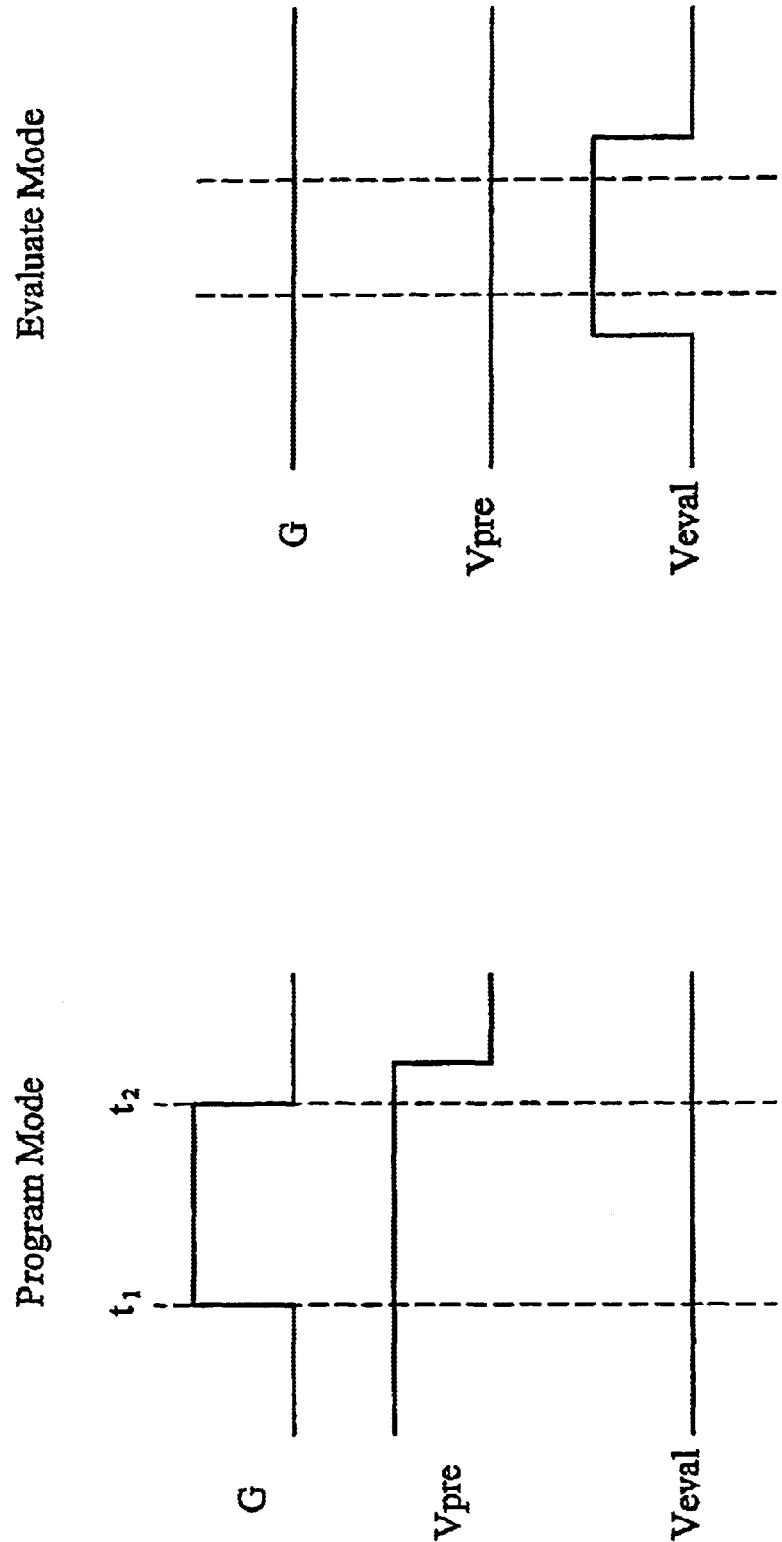
FIG. 3A depicts a representative timing diagram corresponding to a program mode for a one-time programmable fuse device.
FIG. 3B depicts a representative timing diagram corresponding to an evaluate mode for a one-time programmable fuse device.

Representative timing diagrams corresponding to a programming mode and an evaluate mode for a one-time programmable fuse device are depicted in FIGS. 3A and 3B. When the device depicted in FIG. 2 is placed in the program mode, switches SW1 and SW2 are connected to the program terminals PR. While in this configuration, voltage signals will be applied to the device in the manner shown in FIG. 3A. Specifically, an over-voltage signal G is applied between time period $t_1$ and $t_2$. At the same time, the precharge voltage $V_{PRE}$ is applied to the sense amplifier 215 to precharge the bit lines. The evaluation voltage $V_{EVAL}$ remains low during the program mode. The over-voltage signal G causes the oxide in the programmable MOS device 205 to break down at the source and drain regions, thereby creating a short circuit through the programmable MOS device 205. In the evaluate mode, the switches SW1 and SW2 are connected to the evaluate terminals EV. By doing this, the programmable MOS device 205 and the reference MOS device 220 are connected to the evaluate terminals of the memory cell circuit 215. When this is done, the evaluation voltage $V_{EVAL}$ is applied to the device thereby allowing the memory cell circuit 215 to determine the appropriate logical state.

Figure 4:
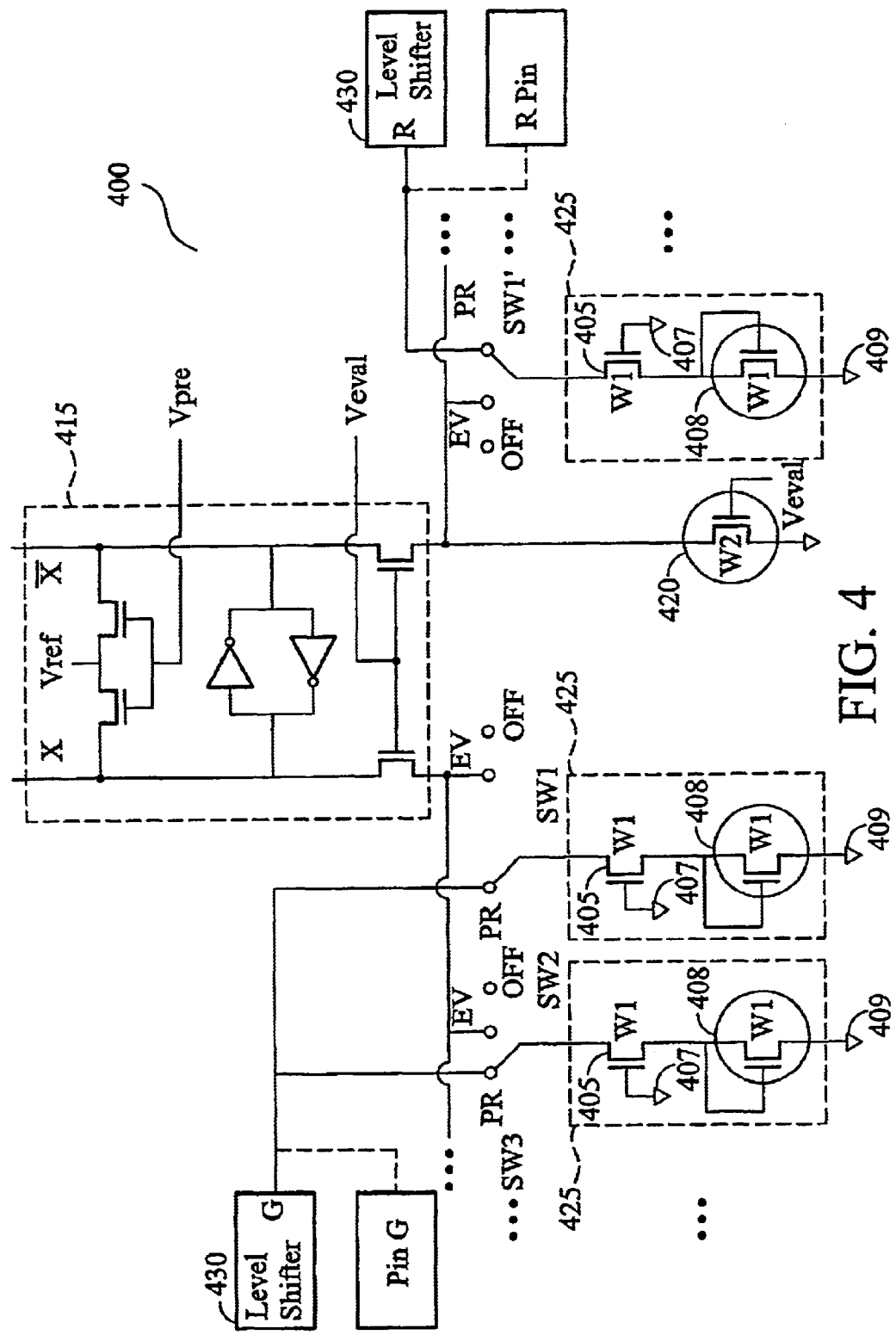
FIG. 4 depicts a representative embodiment of a multiple-time programmable fuse device.

An embodiment allowing multiple-time programmability of the electrical fuses is depicted in FIG. 4. Much like the one-time programmable embodiment depicted in FIG. 2, the multiple-time programmable device 400 includes a sense amplifier 415, programming apparatus 410, and a reference MOS device 420. To accomplish the multiple-time programmability, however, several additional components are included. Instead of a single programmable MOS device 205, a plurality of programmable MOS modules 425 are utilized. Each of the programmable MOS modules 425 includes a programmable MOS device 405 and, optionally, an additional MOS device 408. In the embodiment depicted in FIG. 4, the gate width W1 of the programmable MOS device 405 is the same as the gate width W1 of the additional MOS device 408. Each programmable MOS device 405 has a gate that is connected to a ground terminal 407, a source that is connected to the additional MOS device 408, and a drain that is connected to a switch (e.g., SW1, SW2, etc.). Each additional MOS device 408 has a drain that is connected to its gate, and a source that is connected to a ground terminal 409. As stated previously, however, the additional MOS device 408 can be omitted from this device. Each programmable MOS device 405 in the multiple-time programmable embodiment is programmed in the same way as the single-time programmable embodiment: by applying an overvoltage to its drain. Specifically, a switch (SW I, SW2, etc.) connects the drain of a programmable MOS device 405 to a programming apparatus 410 so that an overvoltage signal G is provided to the programmable MOS device. It is contemplated that only one programmable MOS module 425 will be exposed to an overvoltage signal at a time. The overvoltage signal G causes the oxide regions adjacent to the source and drain to breakdown, thereby turning the programmable MOS device 405 into a closed circuit with a gate width W1. Although the additional MOS device 408 is exposed to the overvoltage signal G, it does not suffer oxide breakdown because the gate of the additional MOS device 408 is connected to its drain, thereby allowing the overvoltage signal to be passed directly to the ground terminal 409. Accordingly, the first-time programming of the multiple-time programmable embodiment proceeds in much the same way as programming the one-time programmable embodiment.

The multiple-time programmable circuit has the ability to erase a previously programmed logic state by activating a programmable MOS module 425 that is parallel to the reference MOS device 420. More specifically, SW1 (which is connected to the programmable MOS module 425 on the right-hand side of FIG. 4) is connected to program erase apparatus 430 through its corresponding programming terminal PR. Much like the programming apparatus 210, the program erase apparatus may comprise a level shifter or a pin that is capable of providing an overvoltage signal R. When the overvoltage signal R is provided, the oxide adjacent the source and drain regions in the programmable MOS device 405 will be broken down. During the subsequent evaluate phase, the bias stored in the bit line XBar will discharge more quickly than the bias stored in bit line X since the total gate width of the ground paths on the right-hand side of FIG. 4 will be W1+W2, which is much greater than the gate width of the programmable MOS module 425 on the left-hand side of the FIG. 4. This difference in current drain will be detected by the sense amplifier 415 and a logic signal where bit line X is high and XBar is low will be presented. The process of programming and erasing may be repeated by activating programmable MOS devices on alternating sides of FIG. 4.

Representative timing diagrams corresponding to the various programming, erasing, and evaluate modes are depicted in FIGS. 5A, 5B, 5C, 5D, and 5D. FIG. 5A depicts a timing diagram corresponding to when the device is programmed for the first time. In FIG. 5A, switch SW1 is connected to the program terminal PR and the remaining switches (SW2, SW3, etc. and SW1', SW2', etc.) are connected to the off terminals OFF. While in this configuration, voltage signals will be applied to the device in the manner shown in FIG. 5A. Specifically, an overvoltage signal G is applied between time period $t_1$ and $t_2$. At the same time, the precharge voltage $V_{PRE}$ is applied to the sense amplifier 415 to precharge the bit lines X and XBar. The evaluation voltage $V_{EVAL}$ and the other over-voltage signal R remain low during the program mode. The over-voltage signal G causes the oxide in the programmable MOS device 405 to break down at the source and drain regions, thereby creating a short circuit through the programmable MOS device 405.

A representative timing diagram corresponding to the first-time erase mode is depicted in FIG. 5B. When the device depicted in FIG. 4 is erased for the first time, switch SW1 is connected to the program terminal PR and the remaining switches (SW1, SW2, SW3, etc. and SW2', SW3', etc.) are connected to the off terminals OFF. While in this configuration, voltage signals will be applied to the device in the manner shown in FIG. 5B. Specifically, an overvoltage signal R is applied between time period $t_1$ and $t_2$. At the same time, the precharge voltage $V_{PRE}$ is applied to the sense amplifier 415 to precharge the bit lines. The evaluation voltage $V_{EVAL}$ and the other over-voltage signal G remain low during the erase mode. The overvoltage signal R causes the oxide in the programmable MOS device 405 to break down at the source and drain regions, thereby creating a short circuit through the programmable MOS device 405.

A representative timing diagram corresponding to the evaluate mode is depicted in FIG. 5C. In the evaluate mode (which occurs shortly after the programming or erase mode), all of the switches (SW1, SW2, SW3, etc. and SW1', SW2', etc.) are connected to the evaluate terminals EV. By doing this, all of the programmable MOS modules 425 and the reference MOS device 420 are connected to the evaluate terminals EV of the sense amplifier 415. When this is done, the evaluation voltage $V_{EVAL}$ is applied to the various MOS devices thereby allowing the sense amplifier 415 to determine the appropriate logical state.

A representative timing diagram corresponding to when the device depicted in FIG. 4 is programmed for the second time is depicted in FIG. 5D. In FIG. 5D, switch SW2 is connected to the program terminal PR and the remaining switches (SW1, SW3, etc. and SW1', SW2', etc.) are connected to the off terminals OFF. While in this configuration, voltage signals will be applied to the device in the manner shown in FIG. 5D. Specifically, an over-voltage signal G is applied between time period $t_1$ and $t_2$. At the same time, the precharge voltage $V_{PRE}$ is applied to the sense amplifier 415 to precharge the bit lines X and XBar. The evaluation voltage $V_{EVAL}$ and the other over-voltage signal R remain low during the program mode. The over-voltage signal G causes the oxide in the programmable MOS device 405 to break down at the source and drain regions, thereby creating a short circuit through the programmable MOS device 405.

Figure 5E:
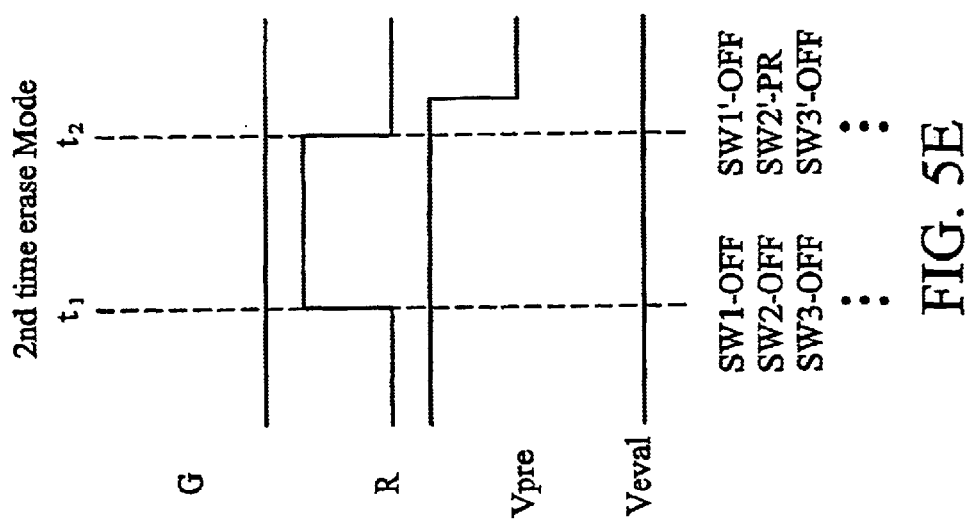
FIG. 5E depicts a representative timing diagram corresponding to a second-time erase mode for a multiple-time programmable fuse device.

A representative timing diagram corresponding to a second-time erase mode is depicted in FIG. 5E. When the device depicted in FIG. 4 is erased for the second time, switch SW2' is connected to the program terminal PR and the remaining switches (SW1, SW2, SW3, etc. and SW1', SW3', etc.) are connected to the off terminals OFF. While in this configuration, voltage signals will be applied to the device in the manner shown in FIG. 5B. Specifically, an overvoltage signal R is applied between time period $t_1$ and $t_2$. At the same time, the precharge voltage $V_{PRE}$ is applied to the sense amplifier 415 to precharge the bit lines X and XBar. The evaluation voltage $V_{EVAL}$ and the other over-voltage signal G remain low during the erase mode. The over-voltage signal R causes the oxide in the programmable MOS device 405 to break down at the source and drain regions, thereby creating a short circuit through the programmable MOS device 405.

We claim:

1. An electrical fuse apparatus comprising:
   a programmable MOS device having a first gate width and including an oxide layer that can be broken down when an overvoltage is provided to the programmable MOS device;
   a reference MOS device having a second gate width that is substantially less than the first gate width;
   a sense amplifier operable to measure a difference in current provided to the programmable MOS device and to the reference MOS device and generate a logic signal based upon whether the oxide layer in the programmable MOS device has been broken down;
   a first switch connected to the programmable MOS device, wherein the first switch is operable to connect the programmable MOS device to one of an overvoltage line or a first sense amplifier terminal; and
   a second switch connected to the reference MOS device, wherein the second switch is operable to connect or disconnect the reference MOS device to a second sense amplifier terminal.

2. An apparatus according to claim 1, wherein a source and gate of the programmable MOS device are connected to a ground terminal and wherein a drain of the programmable MOS device is connected to the first switch; and
   wherein a source of the reference MOS device is connected to a ground terminal, a gate of the reference MOS device is connected to an evaluation voltage line, and drain of the reference MOS device is connected to the second switch.

3. An apparatus according to claim 1 wherein the overvoltage line is connected to a level shifter.

4. An apparatus according to claim 1 wherein the overvoltage line is connected to an overvoltage pin.

5. An apparatus according to claim 1 wherein the programmable MOS device has a gate width in the range of about 10 mm to about 1000 mm.

6. An apparatus according to claim 5 wherein the reference MOS device has gate width in the range of about 10 mm to about 1000 mm.

7. An apparatus according to claim 1 wherein the sense amplifier comprises:
   a pair of evaluation gates, each of which is connected to a respective sense amplifier terminal and to a respective bit line, wherein the pair of evaluation gates are also connected to an evaluation voltage line so that the bit lines are connected to the corresponding sense amplifier terminal when an evaluation voltage is applied;
   a pair of precharge gates, each of which is connected to a reference voltage line, a respective bit line, and a precharge voltage line so that a reference voltage is applied to the bit lines when the precharge voltage is applied; and
   a pair of opposed differential inverters connected to the bit lines so that one bit line is pulled to a high state and the other bit line bit line is pulled to a low state when a difference in voltage is detected between the two bit lines.

8. A multiple-time programmable electrical fuse apparatus comprising:
   a plurality of first MOS modules, each of the first MOS modules comprising a first programmable MOS device having an oxide layer that can be broken down when an overvoltage is provided to the first programmable MOS device, wherein the first programmable MOS device has a first gate width;
   a plurality of second MOS modules, each of the second MOS modules comprising a second programmable MOS device having an oxide layer that can be broken down when an overvoltage is provided to the second programmable MOS device, and wherein the second programmable MOS device has a first gate width;
   a set of first switches connected to the first programmable MOS devices, wherein each of the first switches is operable to connect the first programmable MOS device to a first overvoltage line or to a first terminal of a sense amplifier;
   a reference MOS device having a second gate width that is substantially less than the first gate width, wherein the reference MOS device is connected to a second terminal of the sense amplifier;
   a set of second switches connected to the second programmable MOS devices, wherein each of the second switches is operable to connect the second programmable MOS devices to a second overvoltage line or to the second terminal of the sense amplifier; and
   a sense amplifier operable to measure a difference in current provided to the first terminal and the second terminal and generate a corresponding logic signal.

9. An apparatus according to claim 8,
   wherein each of the first MOS modules further comprises a first shunted MOS device connected to the first programmable MOS device and wherein the first shunted MOS device has a first gate width; and wherein each of the second MOS modules further comprises a second shunted MOS device connected to the second programmable MOS device and wherein the second shunted MOS device has a first gate width.

10. An apparatus according to claim 9,
    wherein a gate of the first programmable MOS device is connected to a ground terminal, a source of the first programmable MOS device is connected to a drain and a gate of the first shunted MOS device, and a drain of the first programmable MOS device is connected to one of the first switches, wherein the first programmable MOS device and the first shunted MOSFET device have a first gate width;

wherein a gate of the second programmable MOS device is connected to a ground terminal, a source of the second programmable MOS device is connected to a drain and a gate of the second shunted MOS device, and a drain of the second programmable MOS device is connected to one of the second switches, wherein the second programmable MOS device and the second shunted MOS device have a first gate width; and wherein a source of the reference MOS device is connected to a ground terminal and a drain of the reference MOS device is connected to a second terminal of sense amplifier.

11. An apparatus according to claim 8 wherein the first overvoltage line is connected to a first level shifter and a second overvoltage line is connected to a second level shifter.

12. An apparatus according to claim 8 wherein the first overvoltage line is connected to a first overvoltage pin and the second overvoltage line is connected to a second overvoltage pin.

13. An apparatus according to claim 8 wherein the first gate width is in the range of about 10 mm to about 1000 mm.

14. An apparatus according to claim 13 wherein the second gate width is in the range of about 10 mm to about 1000 mm.

15. An apparatus according to claim 8 wherein the sense amplifier comprises:

a pair of evaluation gates, each of which is connected to a respective sense amplifier terminal and to a respective bit line, wherein the pair of evaluation gates are also connected to an evaluation voltage line so that the bit lines are connected to the corresponding sense amplifier terminal when an evaluation voltage is applied;

a pair of precharge gates, each of which is connected to a reference voltage line, a respective bit line, and a precharge voltage line so that a reference voltage is applied to the bit lines when the precharge voltage is applied; and a pair of opposed differential inverters connected to the bit lines so that one bit line is pulled to a high state and the other bit line bit line is pulled to a low state when a difference in voltage is detected between the two bit lines.

* * * * *